(12) United States Patent
Peruzzi et al.

(10) Patent No.: US 7,498,876 B2
(45) Date of Patent: Mar. 3, 2009

(54) AMPLIFIER HAVING HALF-WAVE TRACKING POWER RAILS

(75) Inventors: Robert O. Peruzzi, Bethlehem, PA (US); David A. Rich, Monroe Township, NJ (US)

(73) Assignee: Agere Systems Inc., Allentown, PA (US)

( * ) Notice: Subject to any disclaimer, the term of this patent is extended or adjusted under 35 U.S.C. 154(b) by 216 days.

(21) Appl. No.: 11/453,398

(22) Filed: Jun. 15, 2006

(65) Prior Publication Data

US 2006/0284673 A1 Dec. 21, 2006

Related U.S. Application Data

(60) Provisional application No. 60/692,094, filed on Jun. 20, 2005.

(51) Int. Cl.
*H03F 3/38* (2006.01)
*H03G 3/20* (2006.01)
(52) U.S. Cl. .................................. 330/10; 330/136
(58) Field of Classification Search .................. 330/10, 330/136, 207 A, 297
See application file for complete search history.

(56) References Cited

U.S. PATENT DOCUMENTS 5,075,634 A    12/1991  French ...................... 330/146
5,861,777 A *  1/1999   Sigmon et al. .............. 330/136
5,990,751 A *  11/1999  Takita ........................ 330/297
6,166,605 A    12/2000  Carver ........................ 330/297

FOREIGN PATENT DOCUMENTS

JP          57023309 A  *  2/1982

OTHER PUBLICATIONS

"A GSM 2+ Conversion Signal Processor for Continuous Full-Duplex EDGE/GPRS Applications," by R. W. Walden, et al., Published in the Digest of Technical Papers of the 2001 Solid-State Circuits Conference, IEEE International, pp. 350-351.
"Low-Voltage Class AB Buffers With Quiescent Current Control," Fan You, S. H. K. Embabi, and Edgar Sánchez-Sinencio, IEEE Journal of Solid-State Circuits vol. 33, No. 6, Jun. 1998, pp. 915-920.
"A Review and Comparison Of Pulse Width Modulation (PWM) Methods For Analog And Digital Input Switching Power Amplifiers," by Karsten Nielsen, Bang & Olufsen, Denmark, Institute of Automation, Audio Engineering Society, Technical University of Denmark, 102$^{nd}$ Convention Mar. 22-25, 1997 Munich, Germany, pp. 1-57.

* cited by examiner

*Primary Examiner*—Robert Pascal
*Assistant Examiner*—Khiem D Nguyen
(74) *Attorney, Agent, or Firm*—Mendelsohn & Associates, P.C.; Yuri Gruzokov; Steve Mendelsohn

(57) ABSTRACT

An amplifier adapted to generate an analog output signal in response to a digital input signal and having an output stage powered by a power-supply circuit, which generates one or more power rails for the output stage such that at least one of these power rails tracks the output signal and substantially represents a biased and half-wave rectified version of that output signal.

20 Claims, 8 Drawing Sheets

100

300

700

800

930

1100

AMPLIFIER HAVING HALF-WAVE TRACKING POWER RAILS

CROSS-REFERENCE TO RELATED APPLICATIONS

This application claims priority from U.S. Provisional Patent Application No. 60/692,094 filed Jun. 20, 2005, and entitled "Power Amplifier with Half-Tracking Power Rails from Digital PWM D/A Converter," which is incorporated herein in its entirety.

BACKGROUND OF THE INVENTION

1. Field of the Invention

The present invention generally relates, but is not limited, to audio amplifiers and, more specifically, to Class AB amplifiers.

2. Description of the Related Art

A typical audio amplifier uses two complementary transistors (or groups of transistors) to drive a speaker. The amplifier might have a first transistor, which conducts current from the positive power-supply voltage to the speaker for the positive portion of the audio waveform, and a second transistor, which conducts current from the negative power-supply voltage to the speaker for the negative portion of the audio waveform. Audio amplifiers are classified according to the phase-angle portion of the 360-degree signal cycle over which current flows through each of these complementary transistors. The amplifier classes that are relevant to this specification are Classes A, B, AB, and D.

Class A amplifiers are characterized by a continuous current flow through the complementary transistors throughout each signal cycle. Class A amplifiers typically provide greater input-to-output waveform linearity (lower output-signal distortion) than any other amplifier class. However, the efficiency of Class A amplifiers in converting DC-source power into AC-output power is quite poor because the continuous current flow causes a relatively large portion of the DC-source power to be dissipated as heat. As a result, Class A amplifiers find most common use in small-signal applications, where linearity is more important than power efficiency. Less frequently, Class A amplifiers are used in large-signal applications, for which the need for good linearity outweighs the cost and heat disadvantages associated with the poor power efficiency.

Class B amplifiers are designed to have their complementary transistors biased near their current cutoff points, thereby causing current to flow through the transistor only during approximately 180 degrees of each signal cycle. As a result, the power efficiency of Class B amplifiers is significantly higher than that of Class A amplifiers. However, this efficiency improvement comes at the cost of substantial output waveform distortions.

Class AB amplifiers, as their designation suggests, represent a compromise between Class A and Class B types of operation. More specifically, complementary transistors in Class AB amplifiers are biased such that current flows through each transistor for less than 360 degrees, but more than 180 degrees of each signal cycle. Since practically any bias-point between the two limits corresponding to Class A and Class B, respectively, can be used in Class AB amplifiers, the latter represent a continuum ranging from lower-distortion, lower-efficiency amplifiers at one continuum end to higher-distortion, higher-efficiency amplifiers at the other continuum end.

Class D amplifiers differ from Class A, B, and AB amplifiers in that a Class D amplifier operates its complementary transistors in a switch (digital) mode, as opposed to a quasi-linear (analog) mode of operation in Class A, B, and AB amplifiers. A Class D amplifier has relatively high power efficiency because its complementary transistors are either completely turned on or completely turned off. More specifically, when the transistors are conducting (turned on), there is virtually no voltage across the transistor and, therefore, virtually no power dissipation (which is a product of voltage and current) in the transistor. Similarly, when the transistor is turned off and there is a significant voltage across the transistor, there is no current flowing through the transistor and, therefore, again there is virtually no power dissipation. An LC low-pass filter, which is usually connected to the Class D amplifier to reconstruct the analog signal from the "digital" output of the amplifier, is typically a purely reactive circuit, which ideally dissipates no power. As a result, substantially all of the output power is dissipated in the speaker for nearly 100% power efficiency, regardless of the output power level.

While Class D amplification would be a preferred approach to solving the power efficiency problem, practical implementations of Class D amplifiers suitable for an audio application encounter significant problems. For example, an all-digital implementation typically operates in an open-loop configuration, which provides no power-supply ripple rejection. As a result, any in-band power-supply ripple passes through to the speaker, which can produce an audible noise, and any high-frequency power-supply ripple aliases into the signal band by disturbing comparator thresholds. If a smoothing filter configured to remove all unwanted frequency components of the "digital" output stream is used with the amplifier, then the filter's inductors can saturate and the filter's capacitors can show polarization effects. An improved filter performance can be achieved by using specialized (and thus more expensive) parts and/or by increasing the filter's complexity and size.

A mixed analog and digital implementation of a Class D amplifier typically has a closed-loop configuration, which uses a relatively large, multi-bit analog-to-digital converter (ADC). In addition, it is often difficult to achieve stable operation of the closed-loop system due to significant nonlinearities in its feed-forward path. Further problems include (1) difficulties in implementing precision analog signal processing of the mixed analog/digital design in an integrated circuit (IC) environment, especially for a system that handles large voltages and/or currents, and (2) poor compatibility with the deep submicron technology.

SUMMARY OF THE INVENTION

Problems in the prior art are addressed by various embodiments of an amplifier adapted to generate an analog output signal in response to a digital input signal and having an output stage powered by a power-supply circuit, which generates one or more power rails for the output stage such that at least one of these power rails tracks the output signal and substantially represents a biased and half-wave rectified version of that output signal.

According to one embodiment, the present invention is a device comprising: (i) a first amplifier adapted to generate an analog output signal in response to a digital input signal; and (ii) a power supply adapted to power the first amplifier using a first power rail, wherein the first power rail tracks said output signal and substantially represents a biased and half-wave rectified version of said output signal.

According to another embodiment, the present invention is a method of signal amplification comprising: (i) generating a first power rail using a power-supply circuit; and (ii) powering an amplifier using said first power rail, wherein: the amplifier is adapted to generate an analog output signal in response to a digital input signal; and the first power rail tracks the output signal and substantially represents a biased and half-wave rectified version of said output signal.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

In one embodiment, an amplifier of the invention is an amplifier comprising a main amplification path and first and second power-supply paths. The main amplification path has (i) an interpolator and up-sampler (IPUS) adapted to process an input signal to generate a corresponding M-bit digital signal, (ii) a digital-to-analog converter adapted to convert the M-bit digital signal into a corresponding analog signal, and (iii) a power amplifier adapted to amplify said analog signal to generate the output signal. The power amplifier is powered by positive and negative power rails generated by the first and second power-supply paths, respectively. Each of the first and second power-supply paths has a digital pulse-width modulator (PWM) adapted to process a K-bit signal carrying the K most-significant bits of the M-bit digital signal, where K<M, and generate the respective sequence of pulses based on that K-bit signal and a digital control signal specifying an offset voltage between the respective power rail and the output signal. The main amplification path and the first and second power-supply paths share the IPUS, and the amplifier is a Class AB amplifier. Advantageously, amplifiers of the invention can achieve power efficiencies as high as about 80%, while avoiding many of the above-indicated problems associated with Class D amplifiers.

Figure 1A:
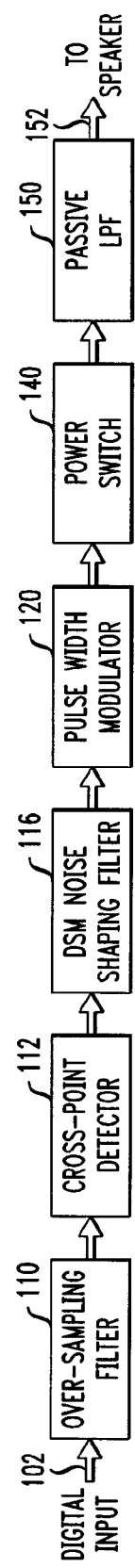
FIGS. 1A-C illustrate a prior-art Class D amplifier.

FIG. 1A shows a block diagram of a prior-art Class D amplifier 100. Amplifier 100 is configured to receive a digital input signal 102, which is typically obtained by quantizing an analog audio waveform. An oversampling filter 110, a cross-point detector 112, and a noise-shaping filter 116 reduce the number of bits applied to a pulse-width modulator (PWM) 120 without excessively increasing quantization noise and distortion. As a result, the clock frequency employed at PWM 120 is reduced compared to the clock frequency that would otherwise be required for the full-resolution processing of digital input signal 102.

Oversampling filter 110 increases the sampling rate of digital signal 102 and reduces distortion. The high end of the audio bandwidth (BW) is 20 kHz, and its Nyquist frequency is twice that, i.e., 40 kHz. Digital input words typically enter oversampling filter 110 at a rate that is slightly higher than the Nyquist frequency, typically 44.1 kHz.

Figure 1B:
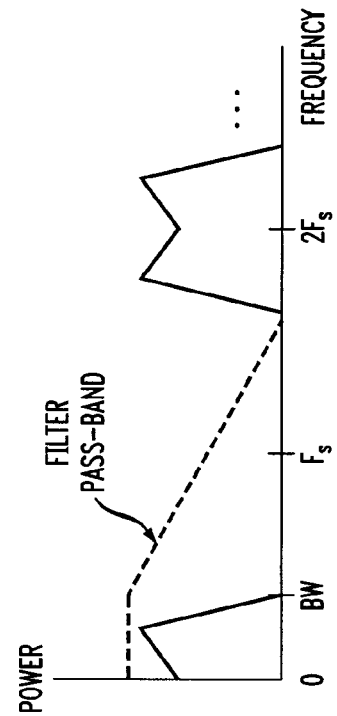

FIG. 1B graphically illustrates spectral characteristics of a low-pass filter that would be required for processing a signal sampled at a slightly higher rate ($F_s$) than the Nyquist rate. More specifically, the solid lines show the signal spectral bands when the signal is sampled at $F_s$. The dashed line shows the filter passband that would be required to filter out the spectral bands located outside of the audio bandwidth. As can be seen, a low pass filter with a relatively sharp cutoff transition would be required.

Figure 1C:
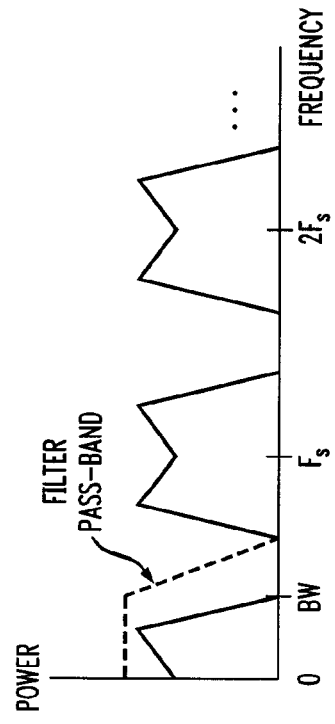

FIG. 1C graphically illustrates spectral characteristics of a low-pass filter that would be required for processing a signal sampled at $2F_s$. Again, as in FIG. 1B, the signal spectral bands are shown with solid lines, and the filter passband is shown with a dashed line. As indicated in FIG. 1C, the signal spectral bands at odd multiples of the sampling rate are eliminated. As a result, a low pass filter with a more gradual cutoff transition can now be used.

Oversampling filter 110 utilizes the effect illustrated in FIGS. 1B-C by interpolating between the input samples provided by signal 102 and then filtering the result. The output of oversampling filter 110 is typically clocked at a multiple of the input frequency. For example, for the 3× oversampling and an input sampling frequency of 44.1 kHz, the interpolator is configured to insert three additional samples and clock the resulting stream at 176.4 kHz into a digital filter, such as a finite impulse response (FIR) filter or an infinite impulse response (IIR) filter.

Cross-point detector 112 processes the output from oversampling filter 110, modifying it by means of linear or non-linear digital signal processing (DSP) techniques, to improve the operation of PWM 120. The processing result is a compromise between natural and uniform sampling methods. More specifically, a typical source of error introduced by uniform sampled pulse-width modulation (UPWM) is harmonic distortion. Because UPWM restricts pulse edges to discrete time points, it causes harmonic distortion where natural sampled pulse-width modulation (NPWM) does not. On the other hand, UPWM eliminates at least one of the NPWM error sources. In particular, in NPWM, there is a mixing of the audio signal and the frequencies of the triangular wave, which aliases back into the signal band. The compromise realized in cross-point detector 112 captures some of the benefits of both UPWM and NPWM, while avoiding the most significant drawbacks of both techniques. Design and implementation of cross-point detectors such as cross-point detector 112 has been a rich area for research, with the examples of cross-point detectors found in the literature ranging from simple and crude circuits to very complex ones, e.g., requiring a dedicated DSP integrated circuit.

Noise-shaping filter 116 is a delta-sigma modulator (DSM), which is configured to reduce the number of input bits applied to PWM 120 and to shape the increased quantization noise out of the audio band. This processing is intended to reduce the required time resolution of the system. For example, without noise-shaping filter 116, if a 16-bit signal sampled at 44.1 kHz were interpolated and 8× oversampled, then the resulting frequency would be 352.8 kHz, with a period of 2.8 µs. The sixteen-bit resolution requires $2^{16}$=65, 536 distinct clock pulses. Thus, the PWM clock would need to run at 65,536×352.8 kHz=23 GHz, with a period of about 43 ps. Even if a low pass filter with an ideal (e.g., abrupt) cutoff transition were available, and oversampling were not required, the PWM clock would need to run at 65,536×44.1 kHz=2.89 GHz, with a period of about 346 ps. Using the DSM noise-shaping implemented in filter 116 and reducing the number of bits to, e.g., eight, one can reduce the PWM clock frequency to $2^8$×352.8 kHz=90.3 MHz.

PWM 120 can be configured to use, e.g., one of several available variations of uniform sampling. For example, one choice is between unipolar ($V_{DD}$ and $V_{SS}$, where $V_{DD}$ and $V_{SS}$ are positive and negative power-supply voltages, respectively) and bipolar ($V_{DD}$, ($V_{DD}$+$V_{SS}$)/2, and $V_{SS}$) outputs. Single-sided modulation uses a sawtooth wave, and there are two choices of the sawtooth shape, i.e., the leading or trailing edge sampling. In contrast, double-sided modulation uses the digital equivalent of a triangular wave and can have one or two samples per cycle. Cross-point detector 112 is configured to appropriately adjust the effective sampling time and level for optimal linearization.

A power switch 140 coupled to the output of PWM 120 is conceptually the same for both NPWM and UPWM. For example, in one implementation, power switch 140 has power MOSFETs in a bridge configuration, connecting a low-pass recovery filter 150 to the power rails of amplifier 100, with the MOSFETs controlled by the output signal generated by PWM 120. One skilled in the art will appreciate that power switch 140 has to be designed with the following issues in mind. For UPWM, the accuracy of pulse edge positioning needs to correspond to the number of input bits, rather than to the number of PWM bits. For example, even when DSM noise shaping filter 116 reduces the number of bits from sixteen to eight, the pulse edge positioning still needs to have the 16-bit accuracy. For both UPWM and NPWM, the rise and fall times of power switch 140 have to be relatively short, and jitter has be limited in order not to increase the amount of noise and distortion. In addition, power-level drift has to be appropriately controlled because this drift modulates the amplitude of the output pulse stream. Furthermore, the power MOSFETs need to be controlled such as to prevent them from being turned ON at the same time. If both power MOSFETs are ON, then a crowbar current will flow directly between the positive and negative power supply terminals. Typically, a break-before-make circuit (BBMC) within power switch 140 processes the output of PWM 120 to generate the corresponding non-overlapping control pulses for the MOSFETs. However, the non-overlap interval can cause a non-linear distortion, which increases with an increase of the non-overlap duration.

The above-described design issues become more and more prominent as the number of processed bits per unit time increases. Several schemes intended to improve the performance of power-switch 140 have been published, including feedback schemes with analog-to-digital converters and additional noise shaping circuits. However, these schemes are disadvantageously complex and often cumbersome to implement. One skilled in the art will appreciate that embodiments of the present invention advantageously overcome the difficulties associated with the design of power switch 140.

Low-pass filter 150, typically second order, prevents the high frequency components from appearing in an output signal 152. In many applications, the inductance and capacitance of a speaker (not shown) and its leads are tuned to function as filter 150. One skilled in the art will appreciate that the following difficulties are typically encountered with low pass filter 150: (1) signal distortion due to inductor saturation can be relatively high; (2) filter errors and non-linearity are not correctable by feedback because the filter operates in an open-loop configuration; (3) the filter transfer function depends upon the load, which makes various speaker types not interchangeable for use with amplifier 100; (4) the residual components of the PWM switching frequency in signal 152 are likely to be radiated from the speaker wires, which, due to the FCC radiation-emission requirements, forces the use of enclosure-mounted speakers; and (5) phase-shift and group-delay distortions introduced by filter 150 are undesirable for non-audio applications.

Figure 2:
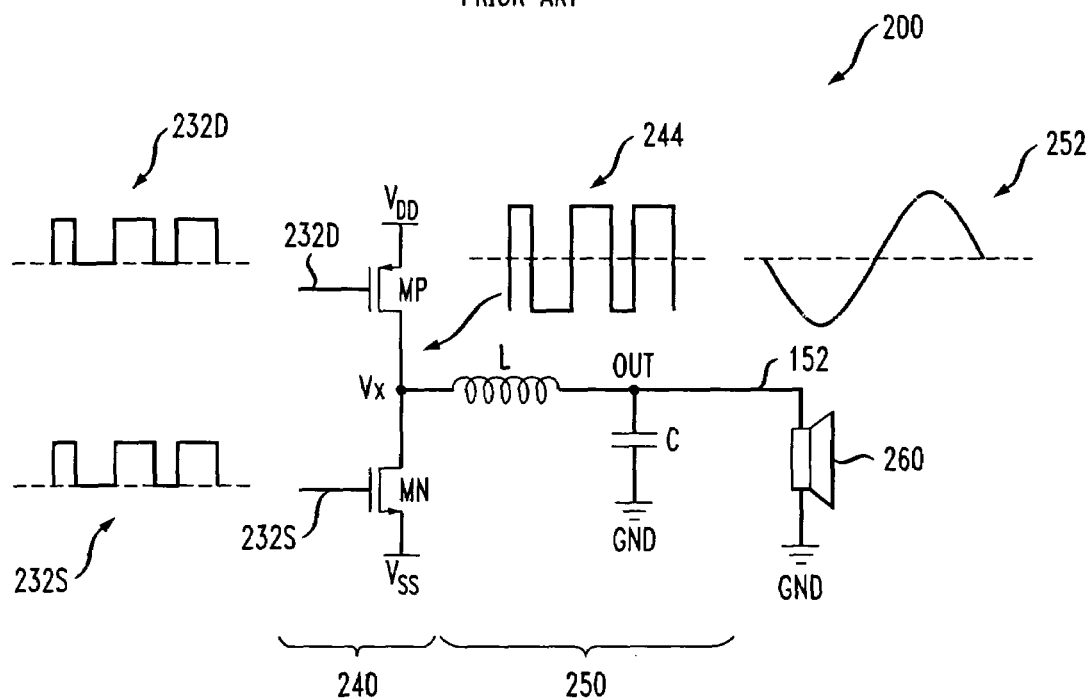
FIG. 2 shows a circuit diagram of a representative output stage for the Class D amplifier shown in FIG. 1.

FIG. 2 shows a circuit diagram of a representative output stage 200 for amplifier 100. More specifically, output stage 200 has a switching block 240 and an output filter 250 that can be used in power switch 140 and output LC filter 150, respectively, of amplifier 100. Also shown in FIG. 2 are representative waveforms for various signals in output stage 200. More specifically, waveforms 232D and 232S correspond to the signals produced by a break-before-make circuit in power switch 140; waveform 252 corresponds to output signal 152, which is applied to a speaker 260; and waveform 244 corresponds to a signal generated in switching block 240 at the terminal labeled $V_X$.

Switching block 240 has a p-channel MOSFET transistor MP and an n-channel MOSFET transistor MN that are serially connected between the $V_{DD}$ and $V_{SS}$ power-supply terminals. Transistor MP is conducting at a high of waveform 232D and not conducting at a low of that waveform. In contrast, transistor MN is conducting at a low of waveform 232S and not conducting at a high of that waveform. Output filter 250 has an inductor L and a capacitor C that are connected in series between terminal $V_X$ and the ground (GND). Inductor L and capacitor C form a low-pass LC filter, which produces at terminal OUT a moving average of the pulse train carried by waveform 244, thereby substantially reconstructing, in an amplified form, the corresponding analog audio waveform. This reconstructed audio waveform drives speaker 260, which plays the corresponding sound.

Since transistors MP and MN act as switches, waveform 244 swings from $V_{DD}$ to $V_{SS}$. Ideally, transistors MP and MN have zero ON-resistance and infinite OFF-resistance and thus dissipate no power in either ON or OFF state. Likewise, no power is ideally dissipated in the LC filter so that all of the power is passed onto speaker 260 for substantially 100% power efficiency.

While providing relatively high power efficiency, the Class D amplifier illustrated by FIGS. 1 and 2 suffers from several problems, some of which have already been outlined above. Due to these problems, a Class D amplifier that is capable of providing high-quality audio signals generally has a relatively complex circuit structure and/or a relatively large size. The latter properties of the amplifier often make it unsuitable for many important consumer applications.

Figure 3:
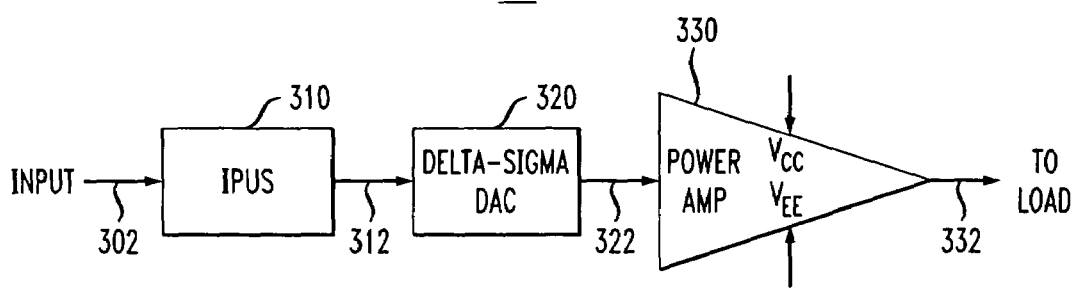
FIG. 3 shows a block diagram of a representative Class AB amplifier.

FIG. 3 shows a block diagram of a representative Class AB amplifier 300. Amplifier 300 is configured to receive a digital input signal 302, which is similar to input signal 102 of FIG. 1. Signal 302 is interpolated and up-sampled in an interpolator and up-sampler (IPUS) 310. The processing performed by IPUS 310 increases the number of signal samples per unit time compared to that in signal 302 by (i) mathematically interpolating the values provided by signal 302 and (ii) re-sampling the interpolation results at a higher rate than that of signal 302. An interpolated and up-sampled signal 312 is applied to a delta-sigma (ΔΣ) digital-to-analog converter (DAC) 320, which produces an analog output signal 322, this output signal being a substantial reconstruction, albeit in a low-voltage form, of the original waveform corresponding to digital input signal 302. A power amplifier 330 amplifies signal 322 to generate an amplified analog output signal 332, which is then applied to an external load (not shown). A detailed description of a ΔΣ-DAC that is suitable for use as ΔΣ-DAC 320 in amplifier 300 can be found, e.g., in an article by R. W. Walden, et al., entitled "A GSM 2+ Conversion Signal Processor for Continuous Full-Duplex EDGE/GPRS Applications," published in the Digest of Technical Papers of the 2001 Solid-State Circuits Conference, IEEE International, pages 350-351, the teachings of which article are incorporated herein by reference.

Figure 4A:
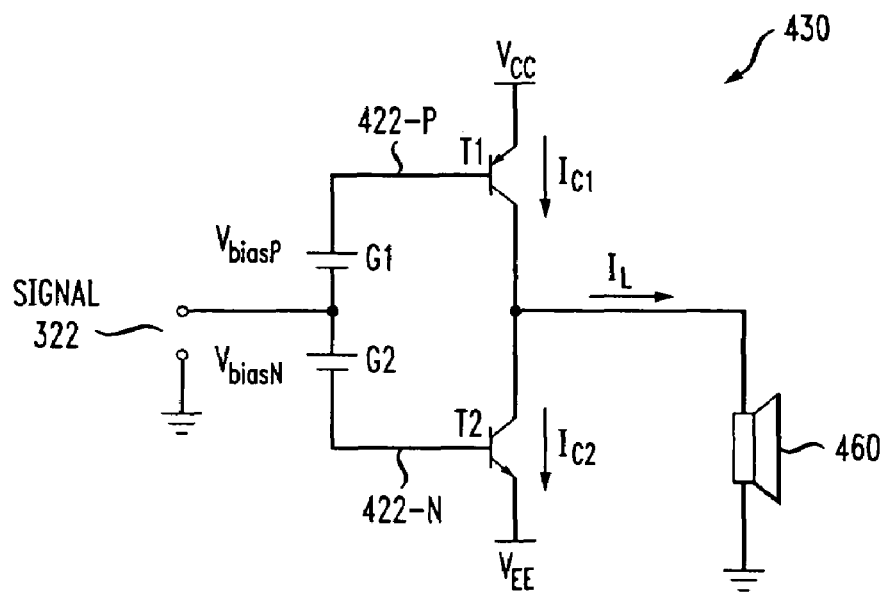
FIG. 4 shows a circuit diagram of a power amplifier that can be used as a power amplifier in the Class AB amplifier shown in FIG. 3.
Figure 4B:
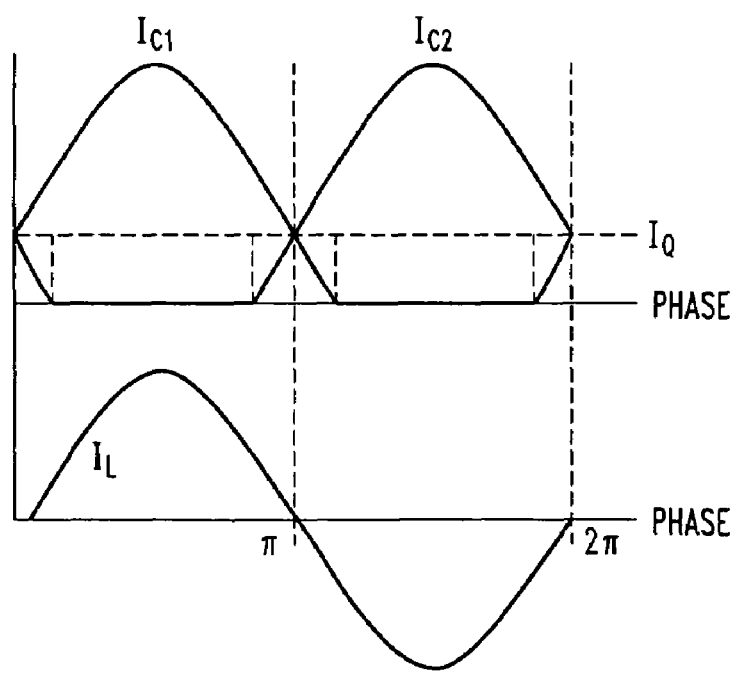

FIGS. 4A-B illustrate an amplifier 430 that can be used as power amplifier 330 in amplifier 300. More specifically, FIG. 4A shows a circuit diagram of amplifier 430, and FIG. 4B graphically shows representative waveforms for various signals in that amplifier. Amplifier 430 has transistors T1 and T2 that are serially connected between the positive and negative power-supply terminals labeled $V_{CC}$ and $V_{EE}$, respectively (see also FIG. 3). Signal 322 applied to amplifier 430 by ΔΣ-DAC 320 is biased with bias voltages $V_{biasP}$ and $V_{biasN}$ generated using bias-voltage generators G1 and G2, respectively, to produce biased signals 422-P and 422-N, which are then applied to the bases of transistors T1 and T2, respectively. When signal 322 is a pure sine wave, signals 422-P and 422-N modulate the currents flowing through transistors T1 and T2 as graphically shown in the top panel of FIG. 4B. More specifically, when signal 322 has a relatively small magnitude, both transistors T1 and T2 are conducting current. However, when signal 322 has a relatively large magnitude, only one of transistors T1 and T2 conducts current, while the other does not. The bottom panel of FIG. 4B graphically shows the resulting net output current, $I_L$, produced by amplifier 430, which output current is the difference between currents $I_{C1}$ and $I_{C2}$ flowing through transistors T1 and T2, respectively. In FIG. 4A, output current $I_L$ is illustratively shown as driving a speaker 460, which plays the corresponding sound. As further detailed below, in addition to audio applications, embodiments of the present invention, including amplifier 430, can also be used in various other (non-audio) applications.

Referring to FIG. 4B, note that there is a small quiescent current, $I_Q$, which flows through transistors T1 and T2 even when output current $I_L$ is zero. The presence of this quiescent current is one of the factors that contributes to the lower power efficiency of amplifier 300 compared to that of, e.g., amplifier 100. Another contributing factor is power dissipation in transistors T1 and T2, which, in contrast to transistors MP and MN of FIG. 2, introduce resistive losses due to being configured to operate in a quasi-linear (analog) mode as opposed to a switch (digital) mode of operation for transistors MP and MN.

Using FIGS. 3-4, one can conceptualize the notion of tracking power rails by thinking about power-supply voltages $V_{CC}$ and $V_{EE}$ as being not constant, but rather tracking, in some manner, signal 322. The use of tracking power rails in amplifiers 330 and 430 can improve their power efficiency over the respective amplifier configurations utilizing constant power rails because the power loss generally increases with an increase of the voltage swing between $V_{CC}$ and $V_{EE}$. With $V_{CC}$ and $V_{EE}$ tracking the signal, the average voltage swing in a tracking power-rail configuration is smaller than the voltage swing in the corresponding constant power-rail configuration. As a result, a tracking power-rail configuration provides a better power efficiency than the corresponding constant power-rail configuration.

Figure 5:
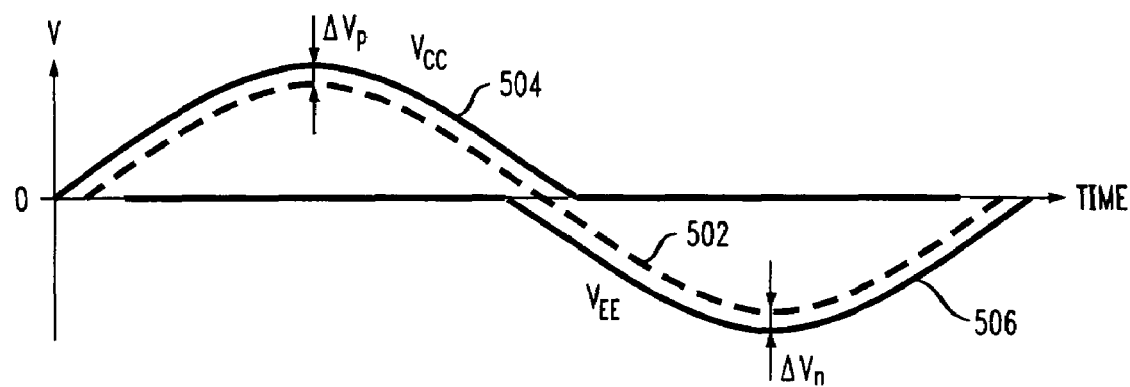
FIG. 5 graphically illustrates tracking power rails that can be used in the amplifiers of FIGS. 3 and 4 according to one embodiment of the invention.

FIG. 5 graphically illustrates tracking power rails that can be used in amplifiers 330 and 430 according to one embodiment of the invention. A dashed curve 502 shows an output waveform, e.g., applied to speaker 460 by amplifier 430 (FIG. 4), and solid curves 504 and 506 show the corresponding $V_{CC}$ and $V_{EE}$ power-rail voltages, respectively. Positive power rail 504 can substantially be obtained from waveform 502 by (i) adding a positive bias voltage, $\Delta V_p$, to that waveform and (ii) applying positive half-wave rectification to the resulting biased waveform. Similarly, negative power rail 506 can substantially be obtained from waveform 502 by (i) adding a negative bias voltage, $\Delta V_n$, to that waveform and (ii) applying negative half-wave rectification to the resulting biased waveform. Note that, in the power-rail scheme of FIG. 5 that employs appropriately small bias voltages $\Delta V_p$ and $\Delta V_n$, the maximum voltage differential between $V_{CC}$ and $V_{EE}$ is significantly smaller than the double amplitude of waveform 502. Since, as already explained above, the power loss in the amplifier is related to the voltage swing between $V_{CC}$ and $V_{EE}$, the power-rail scheme of FIG. 5 is capable of providing relatively high power efficiency.

As will become clear from the description below, each of power rails 504 and 506 does not have to track the shape of waveform 502 precisely, but rather, each of these power rails can be a biased and half-wave rectified version of that waveform. The term "version" means that, although generally following the respective shape shown in FIG. 5, each of power rails 504 and 506 can have distortions, i.e., deviations from the shown shape. These distortions may include, but are not limited to, various parasitic (e.g., cross-talk) signals superimposed onto the shape shown in FIG. 5, additive noise (e.g., thermal noise), various oscillations (e.g., decaying ringing tones), etc. In addition or alternatively, each of power rails 504 and 506 can be time shifted with respect to the shown position. It is preferred however that these signal distortions and/or the time shift do not cause either of power rails 504 and 506 to touch or cross waveform 502.

Figure 6:
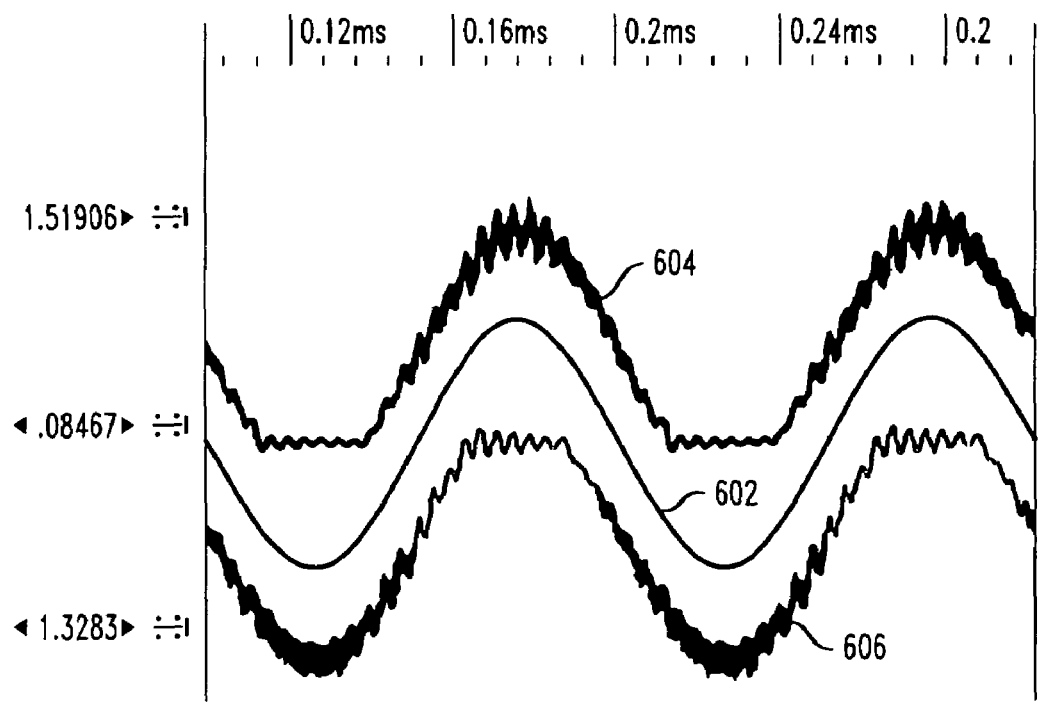
FIG. 6 graphically shows one implementation of the tracking power rails illustrated in FIG. 5.

FIG. 6 graphically shows one implementation of the tracking power rails illustrated in FIG. 5. More specifically, a curve 602 shows an output waveform, e.g., analogous to waveform 502, and curves 604 and 606 show tracking power-rails analogous to power rails 504 and 506, respectively. Positive power rail 604 represents a biased and half-wave rectified "version" of waveform 602 because it generally follows a shape that would have been produced by positively biasing and rectifying that waveform, although power rail 604 also has thermal noise and various oscillations superimposed onto a "pure" biased and half-wave rectified waveform 602. Similarly, negative power rail 606 represents a biased and half-wave rectified "version" of waveform 602 because it generally follows a shape that would have been produced by negatively biasing and rectifying that waveform, although power rail 606 also has thermal noise and oscillations.

Figure 7:
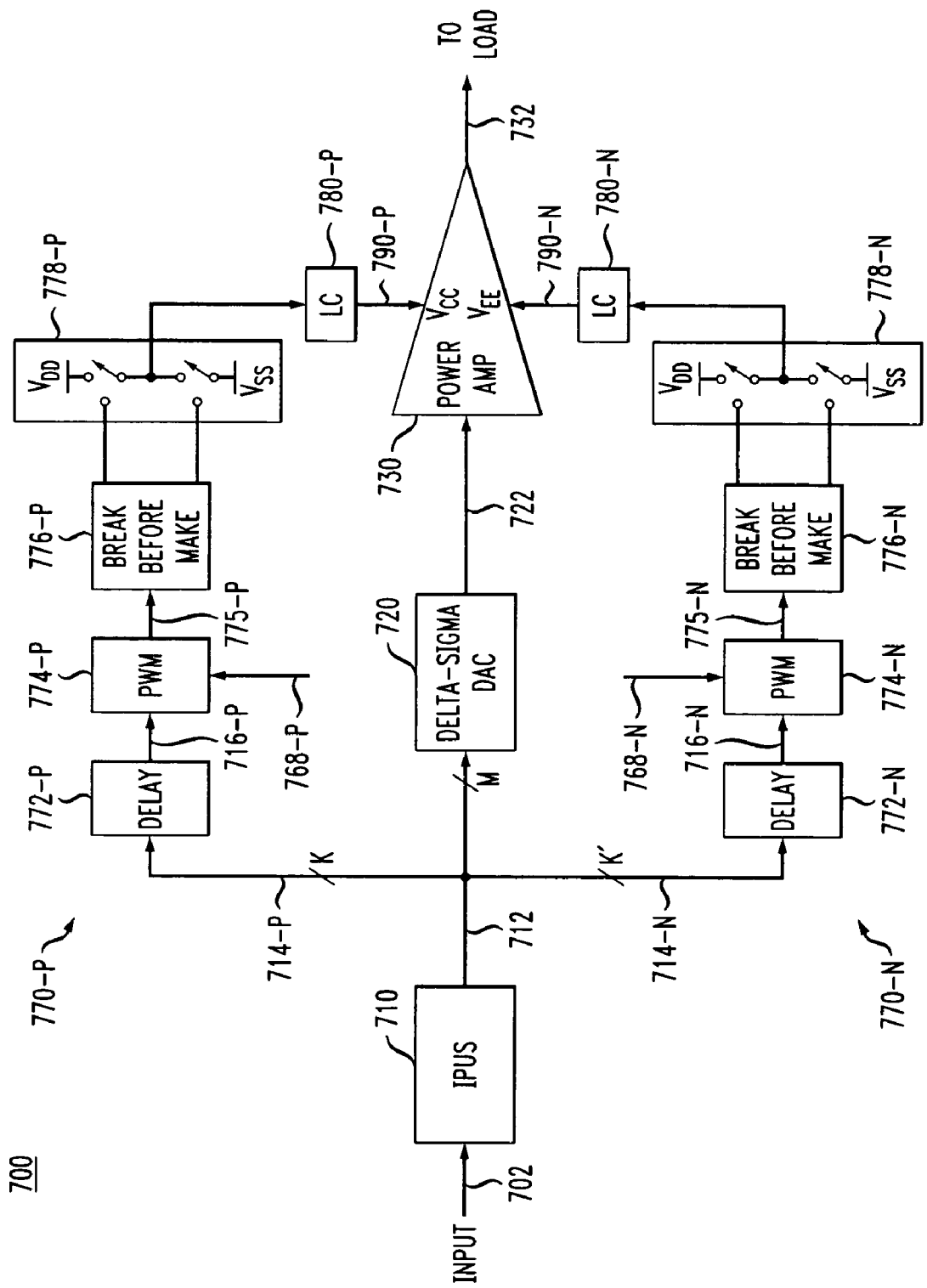
FIG. 7 shows a block diagram of a Class AB amplifier according to one embodiment of the invention.

FIG. 7 shows a block diagram of a Class AB amplifier 700 according to one embodiment of the invention. The main amplification path of amplifier 700 having an IPUS 710, a ΔΣ-DAC 720, and a power amplifier 730 is analogous to that of amplifier 300 (FIG. 3) having similar circuit components, i.e., IPUS 310, ΔΣ-DAC 320, and power amplifier 330. As such, amplifier 700 is adapted to receive a digital input signal 702, which is similar to input signal 302 of FIG. 3, and to generate an amplified analog output signal 732, which can then be applied to a corresponding external load (not shown). In one configuration, input signal 702 is derived from a pulse-code modulated (PCM) signal received by a wireless transceiver, e.g., a cell phone. Amplifier 700 has power-supply paths 770-P and 770-N adapted to generate half-wave tracking power rails 790-P and 790-N, respectively, which are similar to half-wave tracking power rails 604 and 606 of FIG. 6. Paths 770-P and 770-N apply power rails 790-P and 790-N to power amplifier 730 as power supply voltages $V_{CC}$ and $V_{EE}$, respectively (see also FIG. 4A).

Each of power-supply paths 770 of amplifier 700 includes a pulse-width modulator (PWM) 774, a break-before-make circuit (BBMC) 776, a switching block 778, and an LC filter 780. Note also that the main amplification path of amplifier 700 and its power-supply paths 770-P and 770-N share IPUS 710.

In one embodiment, an interpolated and up-sampled signal 712 generated by IPUS 710 is an M-bit signal, all of which M bits are processed by the main amplification path. Of these M bits, only K (where K<M) most significant bits (MSBs) are processed by power-supply path 770. For example, M can be sixteen, and each of paths 770-P and 770-N can receive eight MSBs of signal 712 (i.e., K=K'=8). Alternatively, paths 770-P and 770-N can receive different numbers of MSBs (i.e., K≠K'). In one embodiment, K, K'<<M.

Each of power-supply paths 770 further includes a respective delay circuit 772 configured to provide an appropriate signal delay that accounts for relative processing delays in ΔΣ-DAC 720 and power supply paths 770. More specifically, each delay circuit 772 receives the corresponding signal 714 and delays that signal to produce a corresponding delayed signal 716, which is then applied to PWM 774. The signal delay introduced by delay circuit 772 causes the respective power rail 790 to be appropriately aligned in power amplifier 730 with an analog signal 722 received by the power amplifier from the ΔΣ-DAC and/or analog output signal 732. In one embodiment, each delay circuit 772 is a programmable digital delay circuit.

Signal 716 is applied to PWM 774, which produces an output stream 775 of pulses having a constant amplitude, but varying widths. More specifically, in a representative configuration, the width of each pulse in signal 775 is related to the value of the digital word in the corresponding time slot of signal 716. Signal 775 is applied to BBMC 776, the primary function of which is to ensure that the positive power-supply voltage $V_{DD}$ does not get directly connected to the negative power-supply voltage $V_{SS}$ in switching block 778. The two signals produced by BBMC 776 control two switches in switching block 778. Based on the signals received from BBMC 776, switching block 778 connects output LC filter 780 to either $V_{DD}$ or $V_{SS}$. LC filter 780 is a low-pass filter that is designed to reject out-of-band frequency components of pulse stream 775 and to produce power rail 790.

A control signal 768 applied to PWM 774 digitally controls the offset value between power rail 790 and output signal 732 (see also FIG. 5). Based on signals 716 and 768, PWM 774 generates signal 775 such that this signal is appropriately transformed into the corresponding offset and half-wave rectified power rail after being processed in BBMC 776, switching block 778, and LC filter 780. For example, to provide the offset, PWM 774 adds or subtracts the offset value provided by signal 768 to/from the value of the digital word provided by signal 716 and uses the result to set the pulse widths in the pulse train of signal 775. In addition, to accomplish half-wave rectification, PWM 774 appropriately controls the duty cycle value in the pulse train of signal 775. For example, the duty cycle in the pulse train of signal 775-P is controlled such that the duty cycle value does not fall below 50%, which clamps the minimum of power rail 790-P to $(V_{DD}-V_{SS})/2$. Similarly, the duty cycle in the pulse train of signal 775-N is controlled such that the duty cycle value does not exceed 50%, which clamps the maximum of power rail 790-N to $(V_{DD}-V_{SS})/2$.

Figure 8:
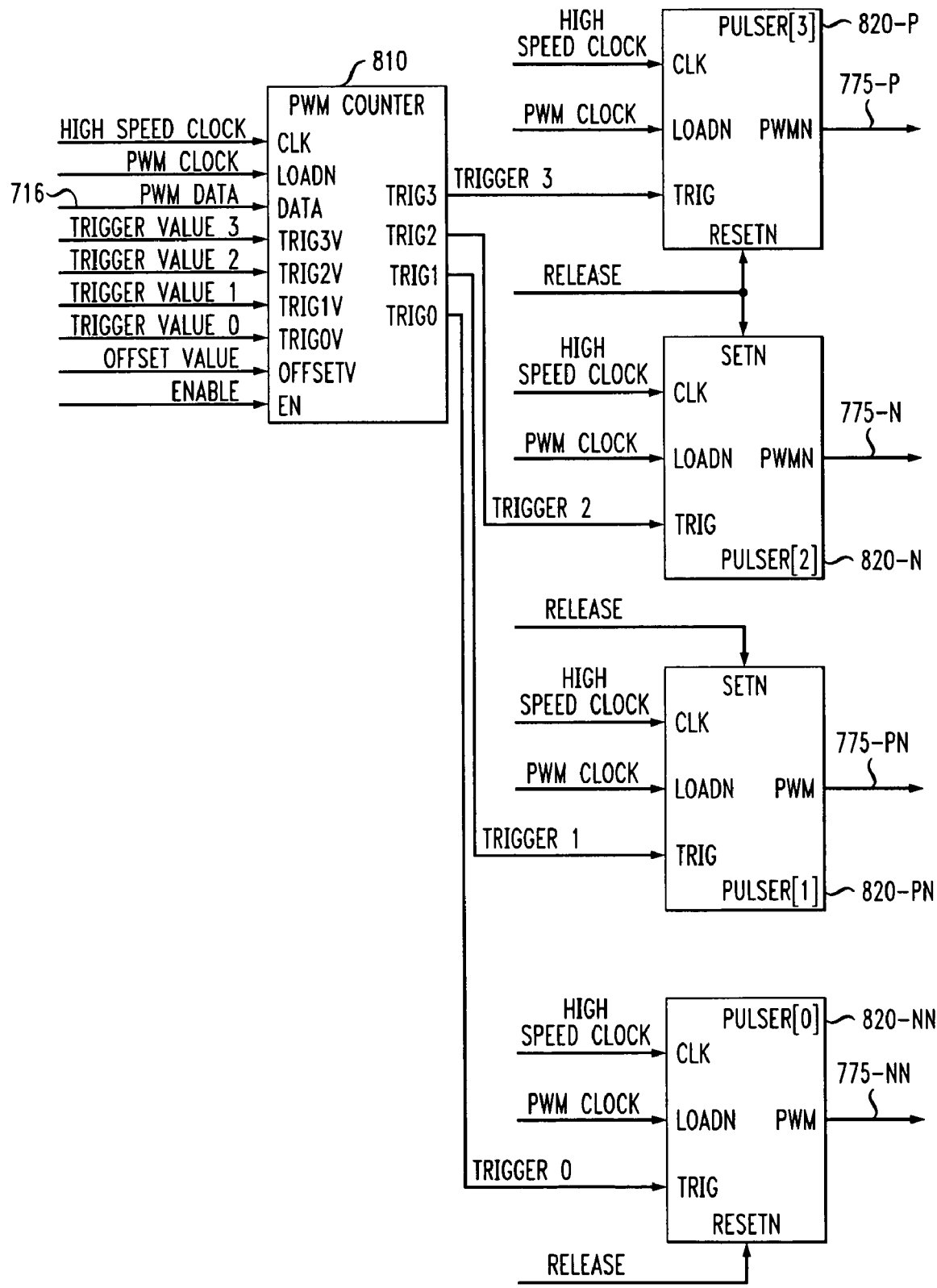
FIG. 8 shows a block diagram of a circuit that can be used in the power-supply paths of the Class AB amplifier of FIG. 7 according to one embodiment of the invention.

FIG. 8 shows a block diagram of a circuit 800 that can be used in power-supply paths 770-P and 770-N according to one embodiment of the invention. More specifically, circuit 800 can be used in an embodiment of amplifier 700, in which (i) K=K' and (ii) a single delay circuit analogous to delay circuit 772 of FIG. 7 is shared by both power-supply paths, thereby resulting in the same input signal to be fed into both power-supply paths in lieu of signals 716-P and 716-N. In addition, when power-supply paths 770-P and 770-N use circuit 800, they share a PWM counter 810, which is described in more detail below.

Circuit 800 is designed to support a fully differential embodiment of amplifier 700. As such, circuit 800 is adapted to generate signals 775-P and 775-N (see also FIG. 7) as well as their inverted variants, which are labeled in FIG. 8 as signals 775-PN and 775-NN, respectively. In this fully differential embodiment of amplifier 700, signals 775-PN and 775-NN can be used to generate inverted variants of power rails 790-P and 790-N, respectively, which inverted variants can then be utilized in power amplifier 730 together with power rails 790-P and 790-N.

PWM counter 810 is designed to operate based on digital counting down from a set-able variable and has the following inputs and outputs:

Input CLK is configured to receive a high speed clock. The period of CLK determines the time resolution of the pulse widths in signals 775. That is, the minimum pulse width increment equals to the period of CLK, and each available pulse width is an integer multiple of that period.

Input LOADN is an active-low latch signal, which configures PWM counter 810 to latch in the value of DATA, synchronously with the negative edge of CLK. Input LOADN is connected to the same clock signal (labeled PWM clock) that clocks the outputs of IPUS 710 and delay block 772.

Input DATA is configured to receive signal 716, and PWM counter 810 is configured to latch in input words provided by signal 716 at the PWM clock rate by input LOADN.

Input TRIG3V controls signal 775-P and therefore power rail 790-P. More specifically, an increase of the value at TRIG3V causes an increase in the "fixed" voltage difference between power rail 790-P and signal 732. In one configuration, d(S790P)/d(TRIG3V)=+10 mV/LSB, where S790P is the magnitude of signal 790-P and LSB stands for the least significant bit of TRIG3V.

Input TRIG2V similarly controls signal 775-N and therefore power rail 790-N. More specifically, a decrease of the value at TRIG2V causes a decrease in the "fixed" voltage difference between power rail 790-N and signal 732. In one configuration, d(S790N)/d(TRIG2V)=+10 mV/LSB, where S790N is the magnitude of signal 790-N and LSB stands for the least significant bit of TRIG2V.

Inputs TRIG1V and TRIG0V similarly control signals 775-PN and 775-NN, respectively. In one configuration, d(S790PN)/d(TRIG1V)=d(S790NN)/d(TRIG0V)=−10 mV/LSB, where S790PN and S790NN are the magnitudes of the inverted variants of signals 790-P and 790-N, respectively.

Input OFFSETV provides an additional degree of freedom in adjusting the tracking rail voltage differences with signal 732. More specifically, increasing the OFFSETV value shifts S790P and S790N down, and shifts S790PN and S790NN up by the same amount. In one configuration, d(S790P)/d(OFFSETV)=d(S790N)/d(OFFSETV)=−10 mV/LSB and d(S790PN)/d(OFFSETV)=d(S790NN)/d(OFFSETV)=+10 mV/LSB. Note that inputs TRIG3V and OFFSETV represent signal bus 768-P, and inputs TRIG2V and OFFSETV represent signal bus 768-N (see FIG. 7).

Input EN enables operation of PWM counter 810.

Output bus TRIG[3:0] provides trigger signals for pulser blocks 820-P, 820-N, 820-PN, and 820-NN. Based on these trigger signals pulser blocks 820 form the trailing edges of pulses in their respective output signals 775.

In one configuration, the operating sequence of PWM counter 810 is as follows. On the negative edge of CLK, when LOADN is low, COUNT (the internal state of the PWM counter 810) is set to the sum of DATA+OFFSETV. As it is loaded, COUNT is compared to the values of the TRIG[3:0]V inputs. If COUNT is less than or equal to one or more of TRIG[3:0]V, the corresponding TRIG[3:0] output is immediately asserted. In this situation, no pulse is generated by the corresponding pulser block 820. On each negative edge of CLK, when LOADN is high and EN is high, COUNT is decremented by one. As COUNT reaches the value of one or more of TRIG[3:0]V, the corresponding TRIG[3:0] output is asserted high for one period of CLK. Note that the TRIG[3:0]V and OFFSETV values are chosen and adjusted to select the desired voltage differences between the tracking power-supply rails and output signal 732. As already mentioned above, to accomplish half-wave rectification, TRIG[3:0]V and OFFSETV are logically manipulated such that power rail 790-N is clamped at a maximum of $(V_{DD}-V_{SS})/2$ by having the duty cycle of signal 775-N not to exceed 50%. Similarly, power rail 790-P is clamped at a minimum of $(V_{DD}-V_{SS})/2$ by having the duty cycle of signal 775-P not to fall below 50%. When EN is low, all four TRIG[3:0]V outputs are low.

Four pulser blocks 820 are designed to generate pulse streams for the respective signals 775. The inputs and outputs of each pulser block 820 are as follows:

Input CLK is configured to receive the high-speed clock, i.e., the same high speed clock as input CLK of PWM counter 810.

Input LOADN is configured to receive the same active-low signal as input LOADN of PWM counter 810. This input configures pulser block 820 to initiate the leading edge of a pulse in signal 775.

Input TRIG configures pulser block 820 to form the trailing edge of the pulse.

Input SETN (in pulser blocks 820-N and 820-PN) is an active-low input. When SETN is low, the corresponding pulser block 820 sets output PWM (in pulser block 820-PN) high and output PWMN (in pulser block 820-N) low. Input SETN is connected to the RELEASE signal, which is further explained below.

Input RESETN (in pulser blocks 820-P and 820-NN) is an active-low input. When RESETN is low, the corresponding pulser block 820 sets output PWM (in pulser block 820-NN) low and output PWMN (in pulser block 820-P) high. Similar to input SETN, input RESETN is connected to the RELEASE signal.

Output PWM (in pulser blocks 820-PN and 820-NN) is configured to produce a leading edge of a pulse, which goes from low to high at the negative edge of CLK when LOADN is low. The trailing edge of the pulse goes from high to low at the negative edge of CLK when TRIG is high.

Output PWMN (in pulser blocks 820-P and 820-N) is configured to produce a leading edge of a pulse, which goes from high to low at the negative edge of CLK when LOADN is low. The railing edge of the pulse goes from low to high at the negative edge of CLK when TRIG is high.

In one configuration, the operating sequence of pulser blocks 820-P and 820-N as it pertains to amplifier 700 is as follows. When the RELEASE signal is low, pulser block 820 is set (reset) such that output PWM (or PWMN) creates a logic level that configures switching block 778-P to hold its output signal at $V_{DD}$, and switching block 778-N to hold its output signal at $V_{SS}$. Setting the RELEASE signal high releases the voltage clamp and allows the pulse generators to operate. When LOADN is low, a negative edge on CLK generates the leading edge of a pulse. The leading edge is negative in the case of PWMN outputs (and is positive in the case of PWM outputs). After a PWM (PWMN) pulse is initiated, when TRIG is asserted, a negative edge on CLK generates the trailing edge of the pulse. The trailing edge is positive in the case of PWMN (and is negative in the case of PWM).

Note that circuit 800 provides digital pulse-width modulation, as opposed to analog pulse-width modulation in the prior-art amplifiers having half-wave rectified tracking power rails (see, e.g., U.S. Pat. Nos. 5,075,634 and 6,166,605, both of which are incorporated herein in their entirety). One difference between analog and digital pulse-width modulation is the character of the relationship between the timing of pulse transitions in the output signal, e.g., signal 775 in FIG. 7, to the relevant clock signals, e.g., signal 716 in FIG. 7 and the high-speed clock signal in FIG. 8. More specifically, in analog pulse-width modulation, pulse transitions in the output signal can occur substantially at any time and the timing of these transitions is not tied to the clock signal. In contrast, in digital pulse-width modulation, pulse transitions in the output signal are tied to the clock signal and the timing of these transitions is in sync with the clock signal. The latter relationship is apparent from the description of circuit 800 above.

Referring briefly to FIGS. 4A-B, when power-supply voltages $V_{CC}$ and $V_{EE}$ are not constant (e.g., are tracking signal 322), operation of amplifier 430 can be adversely affected if bias voltage generators G1 and G2 are not floating voltage generators, but rather, are tied to or powered by $V_{CC}$ and $V_{EE}$. More specifically, if bias voltages $V_{biasP}$ and $V_{biasN}$ vary with signal 322, then quiescent current $I_Q$ is no longer constant. The variable quiescent current causes distortions in currents $I_{C1}$ and $I_{C2}$, which then cause distortions in output current $I_L$. The latter distortions are undesirable because they adversely affect the quality of the output signal. It is therefore desirable to decouple bias voltage generators G1 and G2 from tracking power-supply voltages $V_{CC}$ and $V_{EE}$.

Figure 9:
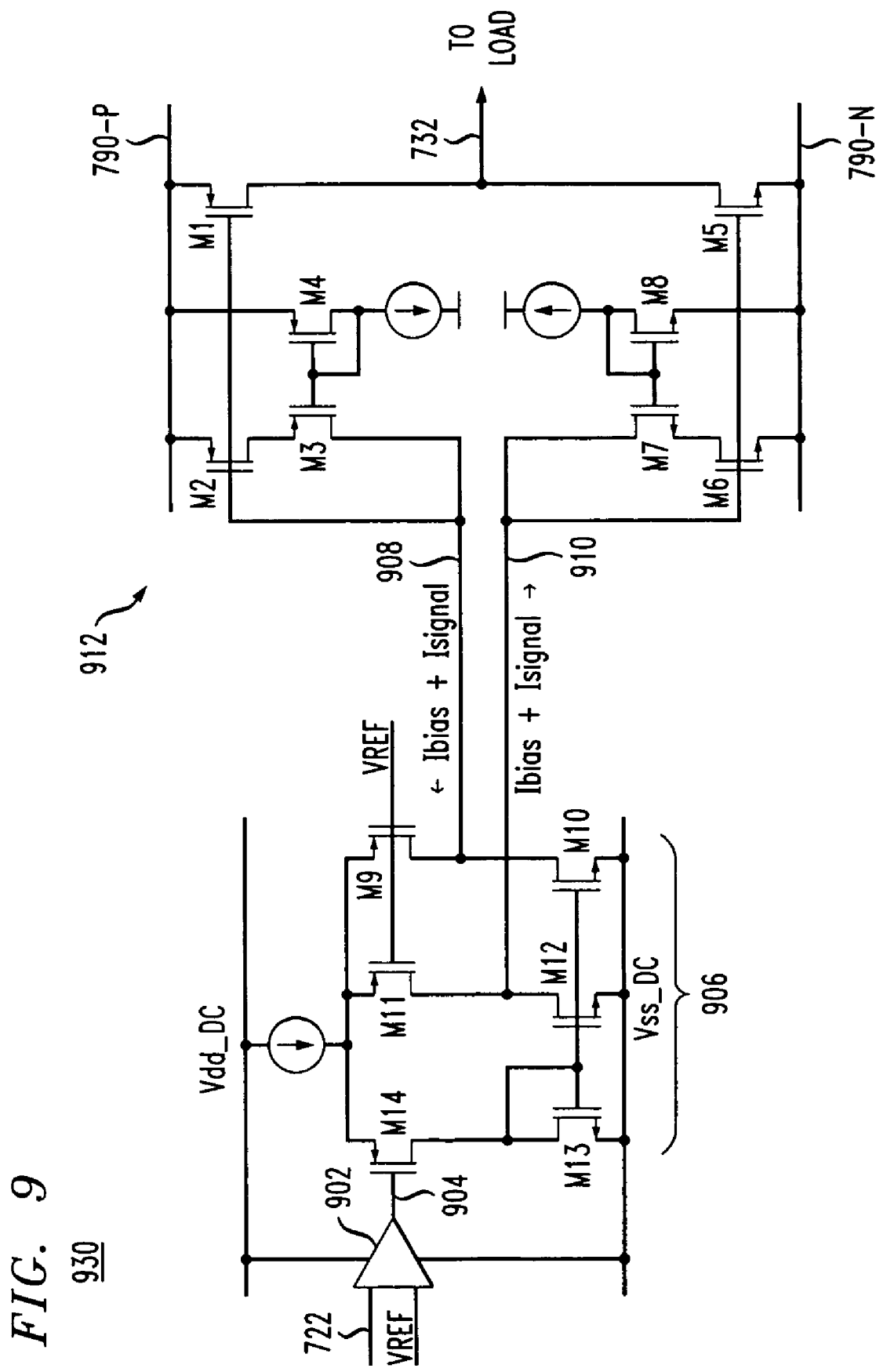
FIG. 9 shows a circuit diagram of a power amplifier that can be used in the Class AB amplifier of FIG. 7 according to one embodiment of the invention.

FIG. 9 shows a diagram of a power amplifier 930 that can be used as power amplifier 730 of FIG. 7 according to one embodiment of the invention. Power amplifier 930 has a three-stage design that addresses the above-described problem of providing bias voltages that are decoupled from tracking power-supply voltages. More specifically, power amplifier 930 comprises gain stages 902, 906, and 912, each of which is described in more detail below.

Gain stage 902 of power amplifier 930 is a differential amplifier configured to receive (i) at its first input terminal, signal 722 (see FIG. 7) and (ii) at its second input terminal, a constant reference voltage, VREF. In one configuration, VREF can be zero (ground). The difference between signal 722 and VREF is amplified to produce a first amplified signal 904. Gain stage 902 is powered using DC power-supply voltages labeled Vdd_DC and Vss_DC.

Gain stage 906 of power amplifier 930 is adapted to convert the voltage of signal 904 into a differential current output represented by signals 908 and 910. More specifically, gain stage 906 has a differential transistor-pair arrangement (having transistors M9-M12) designed to maintain a fixed quiescent current in gain stage 912. Note that the quiescent current value can be controlled by varying the current ratio flowing through transistor pairs (M9, M10) and (M11, M12). Similar to gain stage 902, gain stage 906 is powered using DC power-supply voltages Vdd_DC and Vss_DC. In a different embodiment, other suitable trans-conductance circuits can also be used for gain stage 906.

Unlike gain stage 902 or gain stage 906, each of which uses DC power-supply voltages, gain stage 912 is powered using variable power supply voltages provided by tracking power rails 790-P and 790-N (see also FIG. 7). As already explained above, this variability of power supply voltages could potentially cause undesirable distortions in output signal 732. However, the quiescent current control provided by gain stage 906 substantially prevents these undesirable signal distortions from occurring in signal 732.

At a zero differential current provided by signals 908 and 910, the same amount of current is pulled from the source of transistor M3 and pushed into the source of transistor M7. The sizes of transistors M2, M3, M6, and M7 are chosen such that each of these transistors is in a saturation mode, which, due to its relatively low resistance, causes the gate-to-source voltage, VGS, on each of output transistors M1 and M5 to be relatively small. In this state, transistors M1 and M2 are conducting, thereby effectively providing a Class A type of operation at differential current values in the vicinity of the quiescent current value. Transistors M2 and M3 form a first current mirror that amplifies the current received via signal 908. Similarly, transistors M6 and M7 form a second current mirror that amplifies the current received via signal 910. In a representative configuration, the mirror ratio is about 3.8.

As signal 908 decreases from the value corresponding to the zero differential current, the VGS value for transistors M2 and M1 also decreases until these transistors are turned off completely. Simultaneously, signal 910 increases causing transistor M6 to leave the saturation mode and enter a triode mode of operation. The series resistance of transistors M6 and M7 increases sharply and a large $V_{GS}$ develops on transistor M5, which begins to draw current from ground through the load resistance. For the opposite alternation, transistors M5 and M6 turn off and transistor M1 begins to push current through the load resistance to ground. This current push-pull effected by transistors M1 and M5 represents the analog output signal applied to the external load.

Figure 10:
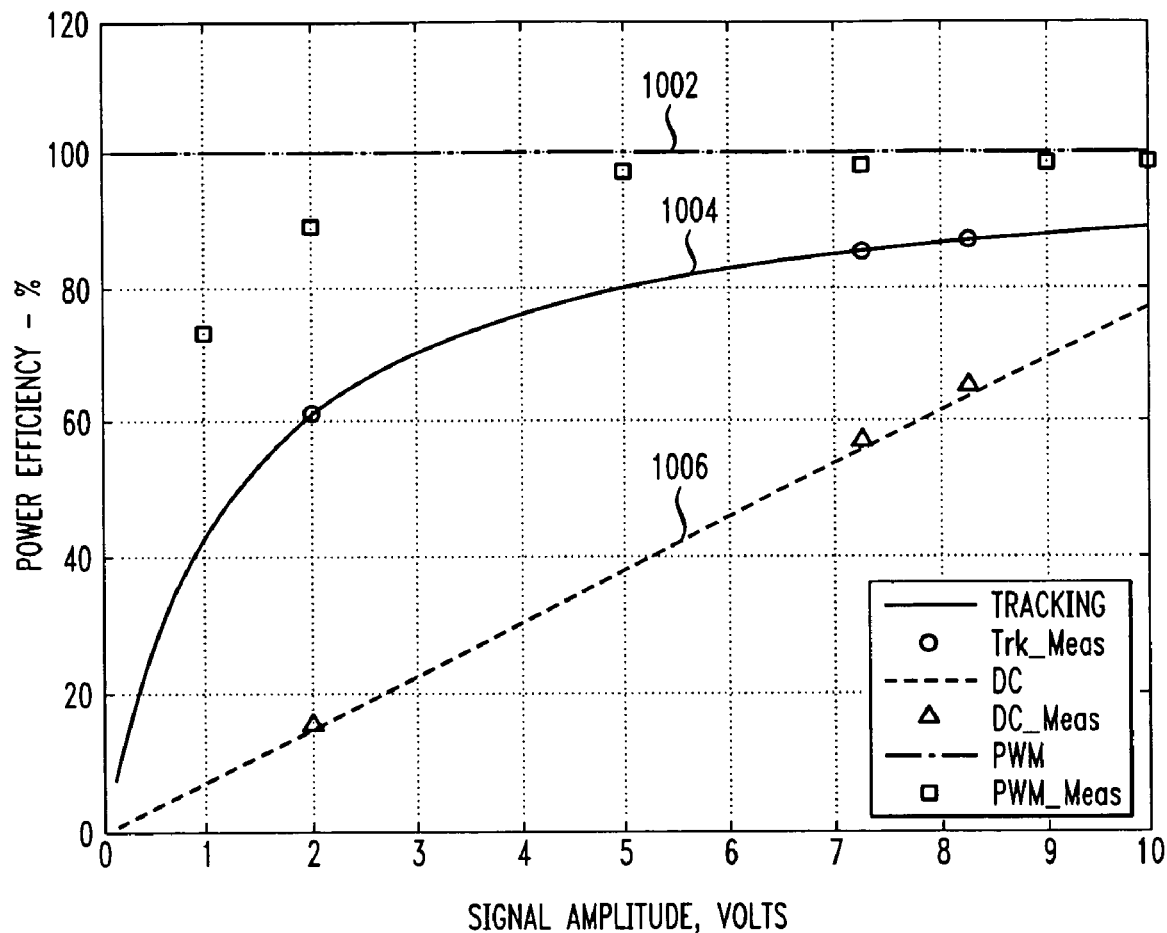
FIG. 10 graphically compares power efficiency of various amplifiers.

FIG. 10 graphically compares power efficiency of various above-described amplifiers. More specifically, line 1002 and the squares correspond to amplifier 100 (FIG. 1); line 1004 and the circles correspond to amplifier 700 (FIG. 7); and line 906 and the triangles correspond to amplifier 300 (FIG. 3) powered using DC voltages $V_{CC}$ and $V_{EE}$. Lines 1002-1006 represent theoretical calculations and the discrete symbols (squares, circles, and triangles) represent experimental measurements for the primary power supply voltage of 10 V. As can be seen in FIG. 9, power efficiency of amplifier 700 is about 88% for signals having an amplitude approaching 10 V, and about 80% for signals having an amplitude in the vicinity of 5 V. These power efficiency values represent (i) a sizable improvement over the corresponding power efficiency values of amplifier 300 powered by DC voltages and (ii) a modest drop from the corresponding power efficiency values of amplifier 100. One skilled in the art will appreciate that this modest drop may be an acceptable price to pay for avoiding many of the problems associated with Class D amplifiers.

Figure 11:
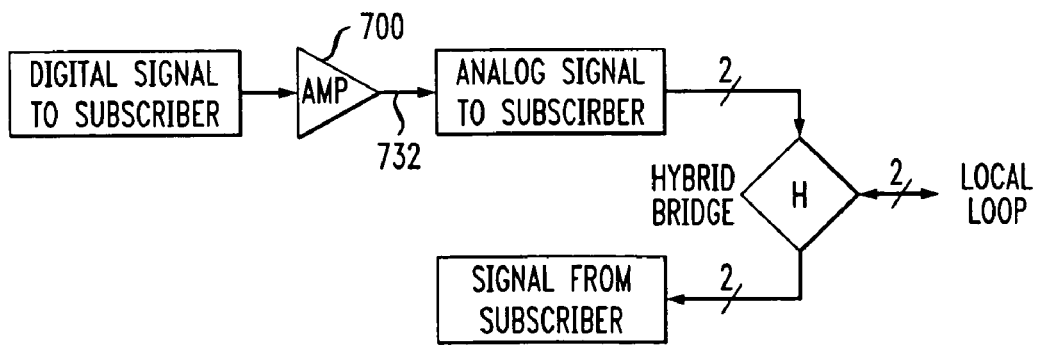
FIG. 11 shows a block diagram of a digital subscriber line (DSL) circuit according to one embodiment of the invention.

FIG. 11 shows a block diagram of a digital subscriber line (DSL) circuit 1100 according to one embodiment of the invention. DSL circuit 1100 is typically located at a DSL central office, which might have a relatively large number (e.g., >1000) of such DSL circuits. Often, the central office equipment having this large number of DSL circuits is buried underground and has a limited temperature-control capacity. If power efficiency of the amplifiers employed by the DSL circuits is poor, then a substantial amount of heat is generated, which, in addition to causing disadvantageously high power consumption, might detrimentally affect the equipment operating conditions at the central office. DSL circuit 1100 addresses this problem by advantageously employing an instance of amplifier 700 (see also FIG. 7), which is characterized by relatively low power consumption and level of heat generation. One skilled in the art will appreciate that amplifier 700 is relatively easy to implement to support modem DSL bit rates of, e.g., greater than about 100 Mb/s.

While this invention has been described with reference to illustrative embodiments, this description is not intended to be construed in a limiting sense. While various circuits of the inventions have been described in reference to audio and DSL signals, these circuits can also be adapted for many other applications, e.g., a motor controller, a voice coil motor for the servo actuator in a hard disc drive, a power supply envelope generator for an RF power amplifier, etc. Although tracking power rails were described as voltages, circuits of the inventions can also use power supply circuits that generate tracking currents. A Class D amplifier in power-supply path 770 can be replaced with a different suitable circuit as long as that circuit enables the power-supply path to generate a signal analogous to one of signals 604 and 606 (FIG. 6). Various modifications of the described embodiments, as well as other embodiments of the invention, which are apparent to persons skilled in the art to which the invention pertains are deemed to lie within the principle and scope of the invention as expressed in the following claims.

While the exemplary embodiments of the present invention have been described with respect to processes of circuits, including possible implementation as a single integrated circuit, the present invention is not so limited. As would be apparent to one skilled in the art, various functions of circuit elements may also be implemented as processing blocks in a software program. Such software may be employed in, for example, a digital signal processor, micro-controller, or general purpose computer.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. A device, comprising:
a first amplifier adapted to generate an analog output signal in response to a digital input signal; and
a power supply adapted to power the first amplifier using a first power rail, wherein:
the first power rail substantially represents a biased and half-wave rectified version of said output signal; and
the power supply comprises a first power-supply path adapted to generate the first power rail based on the digital input signal, said first power-supply path comprising:
a pulse-width modulator (PWM) adapted to process a digital signal corresponding to the input signal to generate a sequence of pulses;
a switching circuit coupled to the PWM and adapted to amplify said sequence of pulses; and
a filter circuit coupled to the switching circuit and adapted to process the amplified sequence of pulses to generate the first power rail.

2. The invention of claim 1, further comprising a main amplification path having the first amplifier, said main amplification path being adapted to process the input signal to generate an M-bit signal, wherein the first power-supply path is adapted to process a K-bit signal carrying K most significant bits (MSBs) of said M-bit signal, where K<M, and generate the first power rail based on said K-bit signal.

3. The invention of claim 2, wherein the main amplification path comprises:
an interpolator and up-sampler (IPUS) adapted to process the input signal to generate said M-bit signal; and
a digital-to-analog converter (DAC) adapted to convert said M-bit signal into a corresponding analog signal, wherein the first amplifier is adapted to amplify said analog signal to generate the analog output signal.

4. The invention of claim 1, wherein the PWM comprises a digital counter configured to control the widths of pulses in said sequence based on: (i) said digital signal corresponding to the input signal and (ii) a digital control signal controlling an offset voltage between the first power rail and the analog output signal.

5. The invention of claim 4, wherein the digital counter is adapted to perform signal rectification by controlling a range of available duty cycle values for said sequence of pulses.

6. The invention of claim 1, wherein the PWM is a digital PWM adapted to generate a clocked digital signal serving as the sequence of pulses.

7. The invention of claim 1, wherein the first power-supply path further comprises a delay circuit adapted to delay the first power rail with respect to the output signal to account for relative signal processing delays in the first power-supply path and in a main amplification path having the first amplifier.

8. The invention of claim 1, wherein the power supply is further adapted to power the first amplifier using a second power rail, wherein the second power rail substantially represents another biased and half-wave rectified version of said output signal.

9. The invention of claim 8, wherein the power supply is adapted to generate the second power rail based on the input signal.

10. The invention of claim 8, wherein:
the first power rail is a positive power rail substantially representing a positively biased and positively half-wave rectified version of the output signal; and
the second power rail is a negative power rail substantially representing a negatively biased and negatively half wave rectified version of the output signal.

11. The invention of claim 1, wherein the first amplifier comprises:
a first stage powered by the power supply using the first power rail and adapted to generate the output signal; and
a second stage powered by the power supply using a DC power rail and adapted to generate a differential signal corresponding to the input signal and apply said differential signal to the first stage, wherein the first stage is adapted to generate the output signal based on said differential signal.

12. The invention of claim 11, wherein:
the differential signal is a differential current signal; and
the second stage is adapted to maintain a fixed quiescent current in the second stage independent of the first power rail.

13. The invention of claim 1, wherein the device is implemented as an integrated circuit and is a part of an audio amplifier adapted to drive a speaker.

14. The invention of claim 1, further comprising a main amplification path having the first amplifier, wherein:
the power supply is further adapted to power the first amplifier using a second power rail, wherein the second power rail substantially represents another biased and half-wave rectified version of said output signal, the power supply further comprising a second power-supply path adapted to generate the second power rail based on the digital input signal;
the main amplification path is adapted to process the input signal to generate an M-bit signal;
the first power-supply path is adapted to process a K-bit signal carrying K most significant bits (MSBs) of said M-bit signal, where K≦M, and generate the first power rail based on said K-bit signal;
the second power-supply path is adapted to process a K'-bit signal carrying K' MSBs of said M-bit signal, where K'≦M and generate the first power rail based on said K'-bit signal;
the main amplification path comprises:
an interpolator and up-sampler (IPUS) adapted to process the input signal to generate said M-bit signal; and
a digital-to-analog converter (DAC) adapted to convert said M-bit signal into a corresponding analog signal, wherein the first amplifier is adapted to amplify said analog signal to generate the analog output signal.

15. The invention of claim 14, wherein each of the second power-supply paths comprises:
a corresponding digital pulse-width modulator (PWM) adapted to process the K'-bit signal corresponding to the input signal to generate a respective clocked digital signal carrying a sequence of pulses;
a corresponding switching circuit coupled to the PWM and adapted to amplify said sequence of pulses;
a corresponding filter circuit coupled to the switching circuit and adapted to process the amplified sequence of pulses to generate the respective one of the first and second power rails; and
a corresponding delay circuit adapted to delay the second power rail with respect to the output signal to account for relative signal processing delays in the second power-supply path and in the main amplification path.

16. The invention of claim 1, wherein the first amplifier is adapted to apply the analog output signal to a digital subscriber line (DSL) to transmit data from a central office to a DSL user.

17. A method of signal amplification, comprising:

generating a first power rail using a power-supply circuit; and powering an amplifier using said first power rail, wherein:

the amplifier is adapted to generate an analog output signal in response to a digital input signal;

the first power rail substantially represents a biased and half-wave rectified version of said output signal; and the power supply circuit comprises a first power-supply path adapted to generate the first power rail based on the digital input signal. said first power-supply path comprising:

a pulse-width modulator (PWM) adapted to process a digital signal corresponding to the input signal to generate a sequence of pulses;

a switching circuit coupled to the PWM and adapted to amplify said sequence of pulses: and a filter circuit coupled to the switching circuit and adapted to process the amplified sequence of pulses to generate the first power rail.

18. The invention of claim 17, further comprising:

generating a second power rail using the power-supply circuit; and powering the amplifier using said second power rail, wherein the second power rail substantially represents another biased and half wave rectified version of said output signal.

19. A device, comprising:

a first amplifier adapted to generate an analog output signal in response to a digital input signal;

a power supply adapted to power the first amplifier using a first power rail, wherein the first power rail substantially represents a biased and half-wave rectified version of said output signal and the power supply comprises a first power-supply path adapted to generate the first power rail based on the digital input signal; and a main amplification path having the first amplifier, said main amplification path being adapted to process the input signal to generate an M-bit signal, wherein the first power-supply path is adapted to process a K-bit signal carrying K most significant bits (MSBs) of said M-bit signal, where K<M, and generate the first power rail based on said K-bit signal.

20. The invention of claim 19, wherein the main amplification path comprises:

an interpolator and up-sampler (IPUS) adapted to process the input signal to generate said M-bit signal; and a digital-to-analog converter (DAC) adapted to convert said M-bit signal into a corresponding analog signal, wherein the first amplifier is adapted to amplify said analog signal to generate the analog output signal.

* * * * *